(12) United States Patent
Yang et al.

(10) Patent No.: US 12,438,044 B2
(45) Date of Patent: Oct. 7, 2025

(54) METHODS AND APPARATUS FOR SEAM REDUCTION OR ELIMINATION

(71) Applicant: Applied Materials, Inc., Santa Clara, CA (US)

(72) Inventors: Yixiong Yang, Santa Clara, CA (US); Seshadri Ganguli, Sunnyvale, CA (US); Srinivas Gandikota, Santa Clara, CA (US); Yong Yang, Mountain View, CA (US); Jacqueline S. Wrench, San Jose, CA (US); Luping Li, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 64 days.

(21) Appl. No.: 17/490,530

(22) Filed: Sep. 30, 2021

(65) Prior Publication Data

US 2022/0108916 A1    Apr. 7, 2022

Related U.S. Application Data

(60) Provisional application No. 63/086,994, filed on Oct. 2, 2020.

(51) Int. Cl.
*H01L 21/768* (2006.01)
*H01L 21/285* (2006.01)
*H01L 21/477* (2006.01)

(52) U.S. Cl.
CPC .. *H01L 21/76846* (2013.01); *H01L 21/28568* (2013.01); *H01L 21/477* (2013.01); *H01L 21/7685* (2013.01); *H01L 21/76865* (2013.01); *H01L 21/76867* (2013.01)

(58) Field of Classification Search
None
See application file for complete search history.

(56) References Cited

U.S. PATENT DOCUMENTS

| | | |
|---|---|---|
| 5,985,754 A | 11/1999 | Aizawa |
| 6,066,891 A | 5/2000 | Yamaoka et al. |
| 9,330,939 B2 | 5/2016 | Zope et al. |
| 2002/0132472 A1* | 9/2002 | Park ............. H01L 21/76879 |
| | | 257/E21.586 |
| 2006/0251800 A1 | 11/2006 | Weidman et al. |
| 2007/0141837 A1 | 6/2007 | Ryu |

(Continued)

FOREIGN PATENT DOCUMENTS

| | | |
|---|---|---|
| JP | 2015-012132 A | 1/2015 |
| JP | 2019044266 A | 3/2019 |

(Continued)

OTHER PUBLICATIONS

CN 105518827, Zope et al, Realizing Seamless Gap Filling Method, Apr. 20, 2016. (Year: 2016).*

(Continued)

*Primary Examiner* — Alexander G Ghyka
(74) *Attorney, Agent, or Firm* — Moser Taboada

(57) ABSTRACT

A method of forming a contact structure in a semiconductor device having a feature includes forming a barrier layer in the feature, wherein the barrier layer is TiN; and forming a metal layer in the feature and over the barrier layer, wherein the metal layer is at least one of aluminum (Al), ruthenium (Ru), or molybdenum (Mo).

3 Claims, 5 Drawing Sheets

(56) References Cited

U.S. PATENT DOCUMENTS

| | | |
|---|---|---|
| 2014/0264867 A1 | 9/2014 | Kuo et al. |
| 2015/0004784 A1 | 1/2015 | Yokoyama et al. |
| 2018/0096888 A1 | 4/2018 | Naik et al. |
| 2018/0233566 A1* | 8/2018 | Gu .................. H01L 29/66795 |
| 2018/0240706 A1 | 8/2018 | Mallick et al. |
| 2018/0247865 A1 | 8/2018 | Adusumilli et al. |
| 2019/0067016 A1 | 2/2019 | Zhu et al. |
| 2019/0206893 A1 | 7/2019 | Liaw |
| 2019/0214296 A1* | 7/2019 | Wang ............... H01L 21/76879 |
| 2019/0311986 A1 | 10/2019 | Amanapu et al. |
| 2020/0235055 A1 | 7/2020 | Hegde et al. |
| 2022/0013365 A1 | 1/2022 | Van Cleemput et al. |

FOREIGN PATENT DOCUMENTS

| | | |
|---|---|---|
| TW | 2012/03456 A | 1/2012 |
| WO | WO 99/27580 A | 6/1999 |
| WO | WO 2013-148490 A | 11/2013 |
| WO | WO 2018-191183 A | 10/2018 |
| WO | WO 2019-154945 A | 8/2019 |

OTHER PUBLICATIONS

Forming Process for Metal Contact of Semiconductor Device, KR20070001734A, Jan. 4, 2007 (Year: 2007).*
International Search Report and Written Opinion for PCT/US2021/052983 dated Jan. 21, 2022.
European Search Report for EP 21876520, dated Aug. 27, 2024.

* cited by examiner

METHODS AND APPARATUS FOR SEAM REDUCTION OR ELIMINATION

CROSS-REFERENCE TO RELATED APPLICATIONS

This application claims benefit of U.S. provisional patent application Ser. No. 63/086,994, filed Oct. 2, 2020, which is herein incorporated by reference in its entirety.

FIELD

Embodiments of the present disclosure generally relate to thin film fabrication techniques.

BACKGROUND

The inventors have observed in many 3D structures that a seam is often formed in a film deposited via atomic layer deposition (ALD) or chemical vapor deposition (CVD). For example, a titanium nitride (TiN) and tungsten (W) stack has been observed to always result in a seam in a trench after the field is pinched off. To illustrate, FIG. 1 schematically depicts a substrate 100 having a base layer 102 in which a feature 104 is formed. A titanium nitride (TiN) layer 106 is first formed over the top surface of the base layer 102, including upon surfaces of the feature 104 (e.g., along sidewalls and bottom of the feature 104). A tungsten (W) layer 108 is subsequently formed atop the TiN layer 106. A seam 110 is observed within the feature 104 after being filled with the TiN layer 106 and the W layer 108. The presence of such a seam is undesirably detrimental to subsequent processing, such as chemical mechanical planarization (CMP) or etch processes. For example, etchant or CMP polishing slurry can undesirably diffuse into the feature through the seam. In addition, the inventors have observed that such seams can also undesirably contribute to the increase of stack resistance.

Therefore, the inventors have provided embodiments of methods and apparatus for filling features with reduced or eliminated seams.

SUMMARY

Embodiments of methods and apparatus for filling features with reduced or eliminated seams are provided herein. Specifically, embodiments of the present disclosure advantageously provide methods and apparatus to minimize, reduce or eliminate seam formation while filling a feature with metals other than tungsten (W) while maintaining the properties of an underlying titanium nitride (TiN) layer. The metal films were demonstrated to provide good gapfill with minimal electrical performance impact. Moreover, since the underlying TiN material properties are preserved, the process can be more easily integrated in a multi-chamber processing tool, as described below.

In some embodiments, a contact structure in a semiconductor device having a feature includes: a barrier layer in the feature, wherein the barrier layer is TiN; and a metal layer in the feature and over the barrier layer, wherein the metal layer is at least one of aluminum (Al), ruthenium (Ru), or molybdenum (Mo), wherein the metal layer is seamless.

In some embodiments, a system for forming a fill material in a feature of a semiconductor device includes: an apparatus configured to form in the feature a barrier layer that is TiN; and an apparatus configured to form in the feature and over the barrier layer a metal layer that is at least one of aluminum (Al), ruthenium (Ru), or molybdenum (Mo), wherein the barrier layer and the metal layer are the fill material, and wherein the fill material is seamless.

In some embodiments, a method of forming a contact structure in a semiconductor device having a feature includes: forming a barrier layer in the feature, wherein the barrier layer is TiN; and forming a metal layer in the feature and over the barrier layer, wherein the metal layer is at least one of aluminum (Al), ruthenium (Ru), or molybdenum (Mo).

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
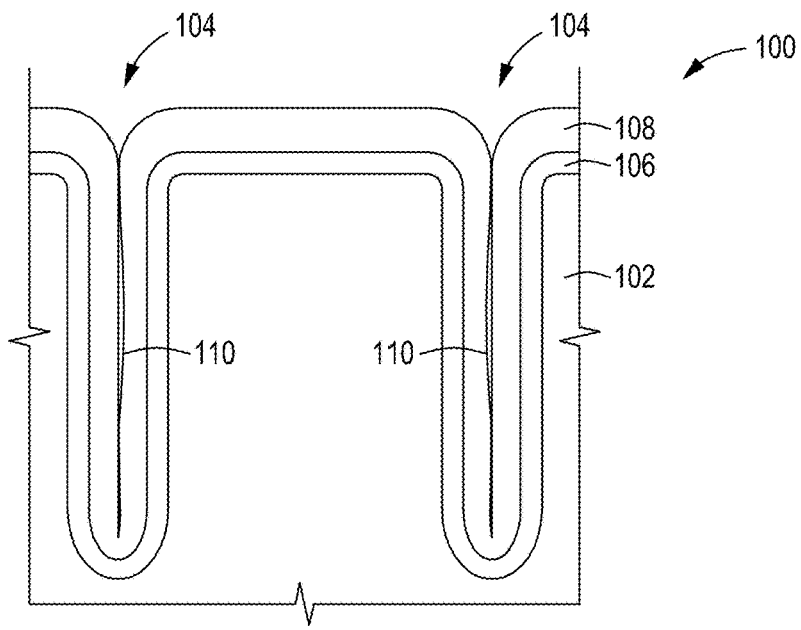
FIG. 1 is a schematic view of a prior art feature filled in a substrate and containing a seam.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for filling features with reduced or eliminated seams are provided herein. Specifically, embodiments of the present disclosure advantageously provide methods and apparatus to reduce or eliminate seam formation while filling a feature with metals other than tungsten (W) while maintaining the properties of an underlying titanium nitride (TiN) layer. The metal films were demonstrated to provide good gapfill with minimal electrical performance impact. Moreover, since the underlying TiN material properties are preserved, the process can be more easily integrated in a multi-chamber processing tool, as described below.

Embodiments of the present disclosure provide a new solution to achieve seam-free (or reduced seam) fill of features formed in substrates. Instead of using TiN and W as fill materials, a family of metal films, including aluminum (Al), ruthenium (Ru), molybdenum (Mo), and the like, were demonstrated to be able to achieve good gapfill without or essentially no seam formation. One suitable non-limiting application is in the scheme of metal gate fabrication.

As used herein, the terms "without seam", "seamless" and the like are intended to mean "no seam" and/or "essentially no seam".

As used herein, the term "essentially no seam" and the like is intended to include structures where a seam is detectable by transition electron microscopy (TEM), but wherein the seam has a width of no more than about 3 angstroms throughout the length of the feature.

Alternatively or additionally, as used herein, the term "essentially no seam" and the like is intended to mean that there is a seam detectable by transition electron microscopy but the seam causes, if at, minimal electrical performance impact on a semiconductor having a feature that is filled.

As used herein, the term "minimal electrical performance impact" and the like is intended to mean that a semiconductor experiences, upon filling a feature therein, a change in flat-band voltage (Vfb) of not more than about 0% to about 5% (e.g., from about 0 to about 5%) and/or a change in equivalent oxide thickness (EOT) of not more than 5% (e.g., from about 0 to about 5%).

Figure 2:
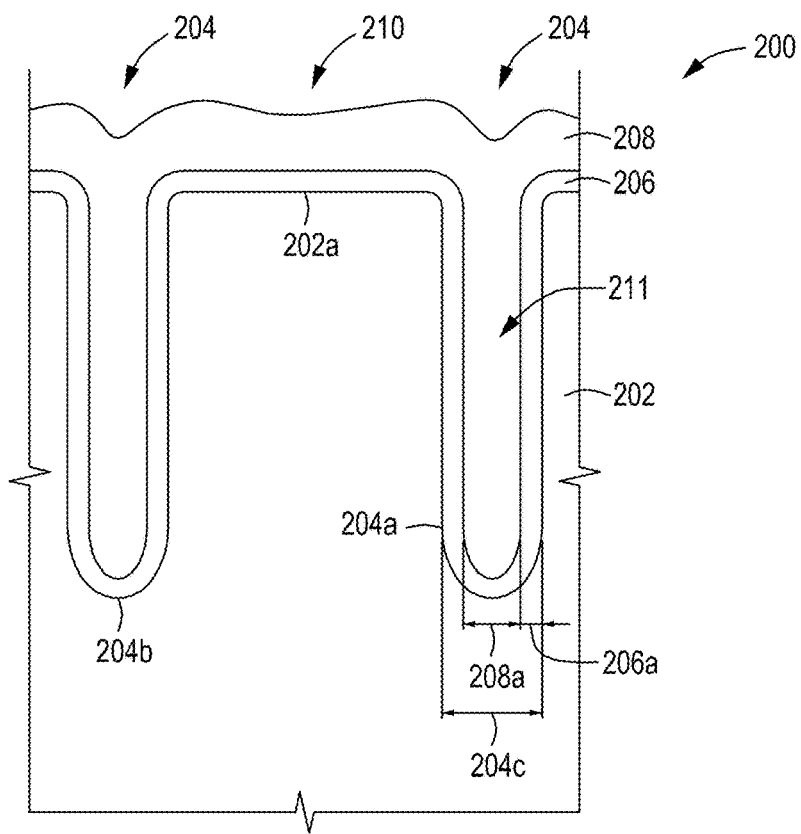
FIG. 2 is a schematic view of a feature filled in a substrate and containing no seam in accordance with embodiments of the present disclosure.

FIG. 2 depicts schematically depicts a substrate 200 having a base layer 202 that may surround a feature 204 and which is formed according to embodiments of the present disclosure. In embodiments, the substrate 200 may be for a contact structure 210, such as in a metal gate.

In embodiments, the base layer 202 can be a layer of a singular material or compound that may include silicon (Si). Alternatively, the base layer 202 can include a plurality of layers (e.g., a film stack), such as may be present during fabrication of a device such as a transistor or the like. The feature 204 can generally be the space 211 disposed between opposing sidewalls 204a of the base layer 202 (or opposite sides of a round or curved sidewall), and which space can extend vertically to a bottom 204b of the feature 204. For example, the feature 204 can be a trench, via, or the like.

In embodiments, a barrier layer 206 can be formed over a top surface 202a of the base layer 202, and upon other surfaces of the feature 204 (e.g., on and along sidewalls 204a and bottom 204b of the feature 204). The barrier layer 206 can generally be deposited to form a conformal layer atop the base layer 202 and within the feature 204, in embodiments, the barrier layer 206 may be directly adjacent to the base layer 202. In other embodiments, the barrier layer 206 may be indirectly adjacent to the base layer 202, wherein one or more other layers are intermediate the base layer 202 and the barrier layer 206.

According to embodiments, the barrier layer 206 can be one layer of a singular material or compound. Alternatively, the barrier layer 206 can include a plurality of layers.

In embodiments, the barrier layer 206 can be a layer(s) of titanium nitride (TiN). In other embodiments, the barrier layer 206 can be a mixture containing TiN. In embodiments, the barrier layer 206 can be about 50 to about 100 weight % TiN. In embodiments, the barrier layer 206 can be deposited by atomic layer deposition (ALD), chemical vapor deposition (CVD), or physical vapor deposition (PVD), for example.

In embodiments, the barrier layer 206 may have total volume in the feature 204 that is about 5% to about 95% of the total volume of the unfilled feature 204. In embodiments, the barrier layer 206 may have a thickness 206a in the feature 204 which is from about 5% to about 95% of a width/diameter (i.e., critical dimension) 204c of the feature 204.

In embodiments, a metal (or contact) layer 208 can be subsequently formed atop the barrier layer 206. In embodiments, the metal layer 208 may be directly adjacent to the barrier layer 206. In other embodiments, the metal layer 208 may be indirectly adjacent to the barrier layer 206, wherein one or more other layers are intermediate the metal layer 208 and the barrier layer 206. The metal layer 208 may extend in and over the feature 204, and over the top surface 202a of the base layer 202. Thereby, the metal layer 208 can serve as an electrical contact layer.

According to embodiments, the metal layer 208 can be one layer of a singular material or compound. Alternatively, the metal layer 208 can include a plurality of layers.

The metal layer 208 can be one of aluminum (Al), molybdenum (Mo), or ruthenium (Ru), according to embodiments. In embodiments, the metal layer 208 may be an alloy of one or more of the foregoing. In embodiments, the metal layer 208 may be a combination of one or more of the foregoing elements and/or alloys.

In embodiments, the metal layer 208 may be about 80 to about 100 weight % Al. In embodiments, the metal layer 208 may be about 80 to about 100 weight % Mo. In embodiments, the metal layer 208 may be about 80 to about 100 weight % Ru. In embodiments, the metal layer 208 may be about 97 to about 180 weight % Ru.

In embodiments, the metal layer 208 may have a total volume in the feature that is about 5% to about 95% of the total volume of the unfilled feature 204. In embodiments, the metal layer 208 may have a thickness 208a in the feature 204 which is from about 5% to about 95% of the width/diameter (i.e., critical dimension) 204c of the feature 204.

In some embodiments the feature 204 has a critical dimension of not more than about 25 nm. In some embodiments the feature 204 has a critical dimension of from about 13 nm to about 25 nm. The barrier layer 206 has a thickness of about 5 to about 95% of the critical dimension of feature 204 and the metal layer 208 has a thickness of about 5 to about 95% of the critical dimension of feature 204. In some embodiments, the barrier layer has a thickness of from about 20 angstroms to about 40 angstroms. In some embodiments, the metal layer has a thickness of from about 20 angstroms to about 40 angstroms.

The metal layer 208 may be seamless and, thus, the gapfill or fill material (i.e., the combined barrier and metal layers 206, 208) may be seamless.

In embodiments, a process to form the TiN barrier layer(s) 206 can include ALD. The base layer 202 can be exposed to a titanium precursor to form a titanium species on the base layer 202. In some embodiments, the titanium precursor may comprise one or more of titanium chloride ($TiCl_4$) titanium fluoride ($TiF_4$), titanium iodide ($TiI_4$), titanium bromide ($TiBr_4$), and tetrakis(dimethylamino)titanium (TDMAT). In specific embodiments, the titanium precursor comprises titanium chloride ($TiCl_4$). In some embodiments, the base layer 202 can be exposed to the titanium precursor at a temperature in a range of from about 200° C. to about 600° C. or from about 200° C. to about 550° C. The base layer 202 may then be exposed to a nitrogen-containing reactant to form a titanium nitride film on the base layer 202. In one or more embodiments, the nitrogen containing reactant can be ammonia ($NH_3$) or hydrazine ($N_2H_4$).

In embodiments, a process to form the TiN barrier layer(s) 206 can include performing a cyclic metal deposition process on the base layer 202 and annealing the TiN barrier layer(s) 206.

In other embodiments, a process to form the TiN barrier layer(s) 206 can include exposing the base layer 202 to a deposition gas mixture to deposit the TiN barrier layer(s) 206 on the base layer 202, and exposing the TiN barrier layer(s) 206 to a plasma treatment process.

In further embodiments, a process to form the TiN barrier layer(s) 206 can include optionally performing a pretreatment process on the base layer 202 (e.g., when the base layer 202 is a substrate), performing a wetting layer deposition to deposit a wetting layer on the base layer 202, performing a cyclic metal deposition to deposit the TiN barrier layer(s) 206 on the base layer 202, and performing an annealing process on the TiN barrier layer(s) 206.

In still other embodiments, a process to form the TiN barrier layer(s) 206 can include optionally performing a pretreatment process on the base layer 202 (e.g., when the base layer 202 is a substrate), performing a barrier layer deposition to deposit a barrier layer on the base layer 202, performing a wetting layer deposition process to deposit a wetting layer on the base layer 202, performing an annealing process on the wetting layer, performing a metal deposition to deposit the TiN barrier layer(s) 206, exposing the TiN barrier layer(s) 206 to a plasma treatment process, and performing an annealing process on the TiN barrier layer(s) 206.

In some embodiments, if the metal layer 208 is molybdenum (Mo) the Mo layer can be deposited, for example, using ALD. For example, a Mo film can be deposited on the TiN barrier layer 206 using an ALD process at a temperature of about 350° C. to about 600° C. and at a pressure of about 1-50 Torr. Suitable precursors can include molybdenum chloride (Mo), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), tetrakis(dimethylamino)molybdenum(IV) and bis(tert-butylimido)-bis(dimethylamido)molybdenum. The resultant Mo film can fill up a space with a critical dimension (CD) of greater than 3 nm.

In other embodiments, if the metal layer 208 is Mo, using atomic layer deposition, the base layer 202 can be exposed to a molybdenum precursor to deposit a film on the barrier layer 206. In one or more embodiments, the molybdenum precursor may comprise one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), tetrakis(dimethylamino)molybdenum(IV), and bis(tert-butylimido)-bis(dimethylamido)molybdenum. In some embodiments, the barrier layer 206 can be exposed to a molybdenum precursor at a pressure in a range of from about 10 Torr to about 50 Torr and at a temperature in a range of from about 400° C. to about 550° C.

Thereafter, in some embodiments, the gap fill process may comprises exposing the barrier layer 206 to a molybdenum precursor and a reactant, e.g., hydrogen ($H_2$), to a form bulk molybdenum film. In one or more embodiments, the molybdenum precursor may comprise one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), tetrakis(dimethylamino)molybdenum(IV), and bis(tert-butylimido)-bis(dimethylamido)molybdenum. In some embodiments, the barrier layer is exposed to a molybdenum precursor at a pressure in a range of from about 10 Torr to about 50 Torr and at a temperature in a range of from about 400° C. to about 550° C. Thereafter, the substrate 200 can be annealed at a temperature in a range of from about 600° C. to about 1200° C. in an atmosphere of nitrogen ($N_2$), helium (He), argon (Ar), hydrogen ($H_2$) gas, or combinations thereof.

In some embodiments, if the metal fill layer 208 is aluminum (Al), the Al layer can be deposited, for example, by CVD. For example, an Al film can be deposited on the TiN barrier layer 206 using a CVD process at a temperature of about 100° C. to about 300° C. and at a pressure of about 1-50 Torr. Suitable precursors can include triethylaluminum (TEA), dimethylaluminum hydride (DMAH), or trimethylaluminum (TMA).

In some embodiments, if the metal layer 208 is ruthenium (Ru), the Ru layer can be deposited, for example, by ALD. For example, a Ru film can be deposited on the TiN barrier layer 206 using an ALD process at about 250° C. to about 350° C. Suitable precursors can include, 0 valent Ru precursor with open diene as one of the ligand. The process uses alkyl halide as a catalyst with halide absorbed on the surface to break away Ru-ligand bond. The inventors have observed that deposition of a Ru film under the foregoing conditions can minimize the roughness of the deposited film, which reduces the presence of any seam in the final structure.

After deposition of the foregoing Ru film, an annealing process can be performed at a temperature of greater than about 400° C., for example between about 400° C. and 450° C., in a hydrogen gas ($H_2$) environment held at about 1-50 Torr for about 1-30 minutes. The annealing process can be performed in the same process chamber, or in a separate chamber configured to perform the annealing process.

In some embodiments, if the metal layer 208 is Ru and the Ru layer is to be deposited ALD, there may be no vacuum breaks between the metal layer 208 deposition and the barrier layer 206 deposition. In some embodiments where there is a vacuum break between the metal layer 208 deposition and the barrier layer 206 deposition, the barrier layer 206 may be pretreated. In embodiments, the pretreatment may utilize N or H radicals, or direct plasma. For example, a Metal Clean version xT (MCxT) or similar chamber can be used to employ inductively coupled plasma with $H_2$ or with an $H_2/N_2$ mixture and a biased pedestal to react out oxygen from the TiN barrier layer. In embodiments, the plasma power may be from about 400 W to about 900 W and a bias may be from about 50 W to about 300 W.

In some embodiments, if the metal layer 208 is Ru and the Ru layer is to be deposited by ALD, a precursor can be an Ru-diene, such as p-cymene Ru hexadiene or p-cymene Ru cyclohexadiene. A catalyst can be an alkyl halide, such as alkyl iodide or alkyl bromide. In embodiments, the barrier layer 206 may be pre-soaked with the catalyst at a temperature from about 250° C. to about 350° C. Pressure may be about 20 Torr from about 10 seconds to about 60 seconds. In embodiments, the foregoing pre-soaking may be followed by one cycle of Ru deposition and then repeated for up to five cycles.

In some embodiments, if the metal layer 208 is Ru and the Ru layer is to be deposited by ALD, the deposited metal layer 208 can be annealed, such as at a temperature up to about 450° C., for example from about 400° C. to about 450° C. The metal layer 208 can be annealed for a duration of from about 5 minutes to about 30 minutes. In some embodiments, the metal layer 208 can be annealed in an $H_2$ environment. The inventors observed that annealing in the presence of H2 can advantageously lower the duration needed for the anneal.

MOSCAP testing was conducted to evaluate the electrical impact by the materials of the metal fill layer 208. Data advantageously shows the electrical impact is minimal.

In some embodiments, the deposition of the films for the metal fill layer 208 and the barrier layer 206 can be performed in standalone processing chambers. Alternatively and advantageously, the deposition of the films for the metal layer 208 and the barrier layer 206 can be integrated within a multi-chamber processing system (e.g., a cluster tool), such as the line of ENDURA® processing tools available from Applied Materials, Inc. of Santa Clara, California.

Figure 3:
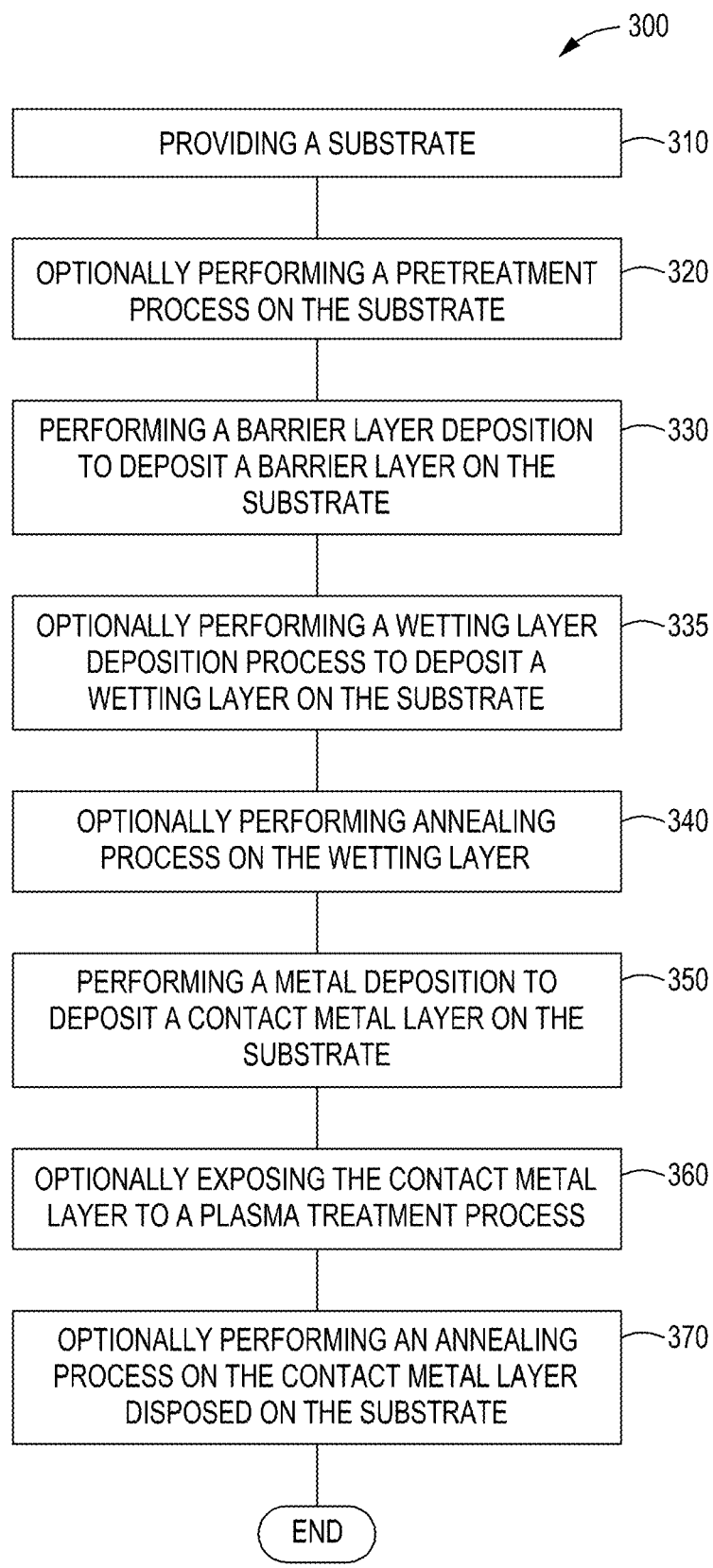
FIG. 3 is a flow chart of a method of forming a semiconductor structure having a gapfill in a feature in accordance with embodiments of the present disclosure.

FIG. 3 is a flow diagram of a method 300 which can be employed to make a semiconductor device structure on a substrate in accordance with embodiments of the present disclosure, such as the embodiments shown in FIGS. 2A-2F. In embodiments, the method 300 may be employed to make a contact structure of a gate of a semiconductor. The method 300 may correspond to fabrication stages depicted in FIGS. 4A-4E. For illustrative purposes, the method of FIG. 3 is generally provided with reference to a CVD, ALD, or PVD deposited barrier layer and/or metal contact layer. In embodiments, the method 300 may eliminate/prevent a seam being formed in the contact structure.

Figure 4A:
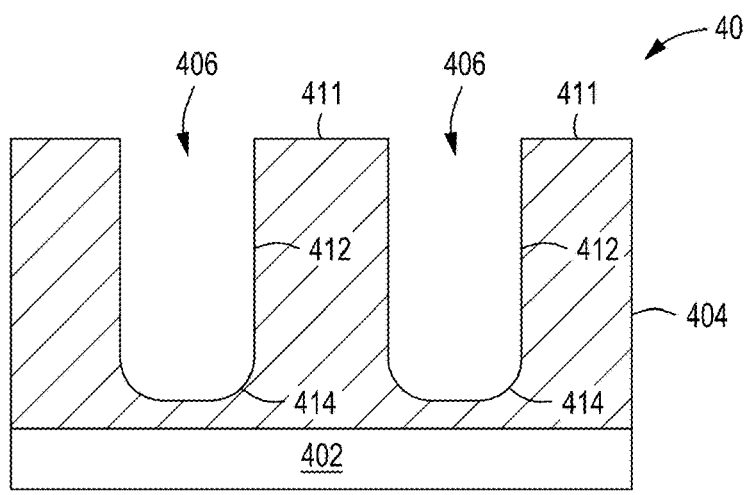
FIGS. 4A-4E depict cross-sectional views of forming a semiconductor structure having a gapfill in a feature in accordance with embodiments of the present disclosure.

The method 300 may start at block 310 by providing a substrate, such as the substrate 402 depicted in FIG. 4A, in a processing chamber. The substrate 402 shown in FIG. 4A includes a semiconductor device structure 408 (e.g., such as a gate structure or other structures configured to form a contact structure) formed on the substrate 402.

A silicon layer 404 can be formed on the substrate 402 having feature(s) 406 formed therein. The feature(s) 406 (which may be a contact opening, contact via, contact trench, contact channel or the like) can be formed in the device structure 408 and have sidewalls 412 and a bottom 414 which form an open channel to expose the underlying silicon layer 404. The silicon layer 404 may include any suitable layers such as a single silicon layer or a multiple layer film stack having at least one silicon layer formed therein.

In an embodiment wherein the silicon layer 404 is in the form of a single layer, the silicon layer 404 may be a silicon oxide layer, an oxide layer, a silicon nitride layer, a nitride layer, a silicon oxynitride layer, a titanium nitride layer, a polysilicon layer, a microcrystalline silicon layer, a monocrystalline silicon, a doped polysilicon layer, a doped microcrystalline silicon layer, or a doped monocrystalline silicon.

In an embodiment wherein the silicon layer 404 is a film stack, the stack may include a composite oxide and nitride layer, at least one or more oxide layers sandwiching a nitride layer, and combinations thereof. Suitable dopants doped in the silicon layer 404 may include p-type dopants and n-type dopants, such as boron (B) containing dopants or phosphine (P) containing dopants.

In embodiments wherein the silicon layer 404 is in form of a multiple film stack having at least one silicon containing layer, the silicon layer 404 may include repeating pairs of layers including a silicon layer and a dielectric layer. In embodiments, the silicon layer 404 may include a polysilicon layer and/or other metal materials and/or a dielectric layer disposed therein. Suitable examples of the dielectric layer may be selected from a group consisting of an oxide layer, silicon oxide layer, a silicon nitride layer, a nitride layer, titanium nitride layer, a composite of oxide and nitride layer, at least one or more oxide layers sandwiching a nitride layer, and combinations thereof, among others.

Prior to transferring the substrate 402 into the processing chamber at block 310, a pre-cleaning process, at block 320, may be optionally performed to treat substrate surfaces 411 sidewalls 412 and bottoms 414 of the openings/features 406 to remove native oxides or other sources of contaminants. Removal of native oxides or other sources of contaminants from the substrate 402 may provide a low contact resistance surface to form a good contact surface for forming a barrier layer.

The pre-cleaning process, at block 320, may include supplying a pre-cleaning gas mixture into a pre-cleaning chamber. The pre-cleaning chamber may be a Preclean PCII, PCXT or Siconi™ chambers which are available from Applied Materials, Inc., Santa Clara, California. The pre-cleaning process may include supplying a cleaning gas mixture into the pre-cleaning chamber to form a plasma from the pre-cleaning gas mixture for removing the native oxide. In embodiments, the pre-cleaning gas mixture can be a mixture of ammonia and nitrogen trifluoride gases. The amount of each gas introduced into the processing chamber may be varied and adjusted to accommodate, for example, the thickness of the native oxide layer to be removed, the geometry of the substrate being cleaned, the volume capacity of the plasma, the volume capacity of the chamber body, as well as the capabilities of the vacuum system coupled to the chamber body.

Figure 4B:
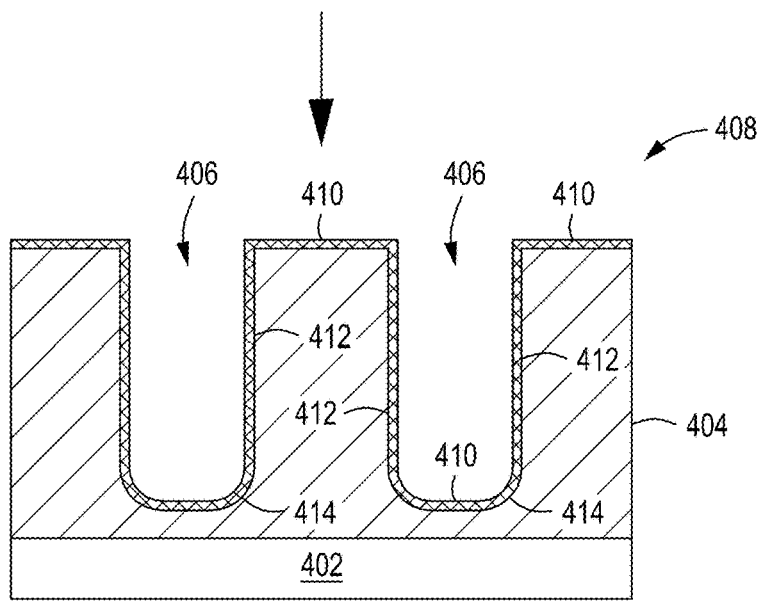

Also at block 320, a pretreatment process may be optionally performed to pre-treat the substrate surface 411, thus forming a treated surface region 410 on the surface 411, sidewalls 412 and bottoms 414 of the features 406 in the silicon layer 404, as shown in FIG. 4B. The pretreatment process at block 320 may be performed to alter the surface bonding structure of the silicon layer 404, thereby providing a surface having a good absorption ability to promote adherence of metallic atoms provided from the subsequent barrier layer deposition process. A pre-treatment gas mixture may include at least a hydrogen containing gas, such as H2, H2O, H2O2, or the like. An inert gas, such as Ar, He, Kr, and the like, may also be supplied into the pre-treatment gas mixture.

Figure 4C:
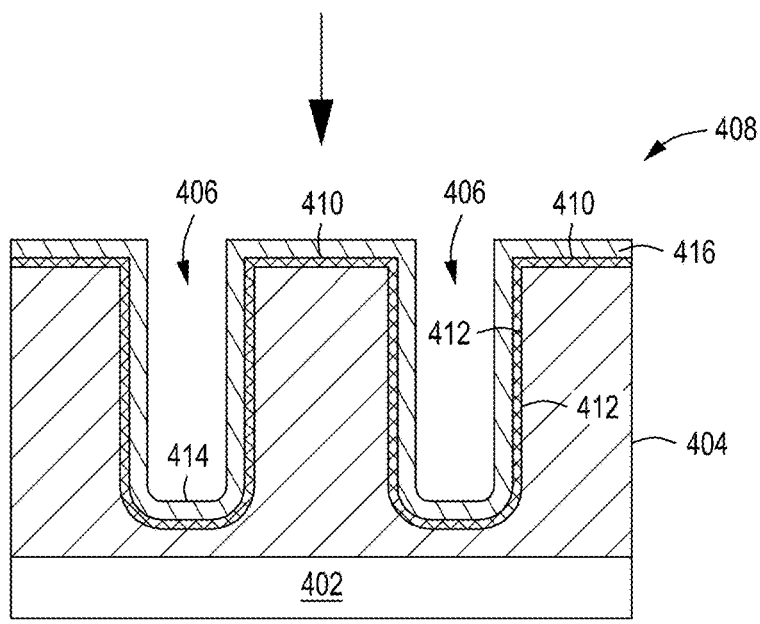

At block 330, a barrier layer deposition process may be performed to deposit a barrier layer 416 on the substrate, and/or on the treated surface region 410, as shown in FIG. 4C. The barrier layer 416 may prevent diffusion of the contact metal layer to the junction material on the substrate, typically a silicon or silicon germanium compound. The barrier layer 416 can be deposited by, for example, atomic layer deposition (ALD), plasma enhanced atomic layer deposition (PEALD), chemical vapor deposition (CVD), plasma enhanced CVD (PECVD), or physical vapor deposition (PVD). In embodiments, the barrier layer 416 may have a thickness within a range from about 2 Å to about 100 Å, or from about 3 Å to about 80 Å, or from about 4 Å to about 50 Å.

Figure 4D:
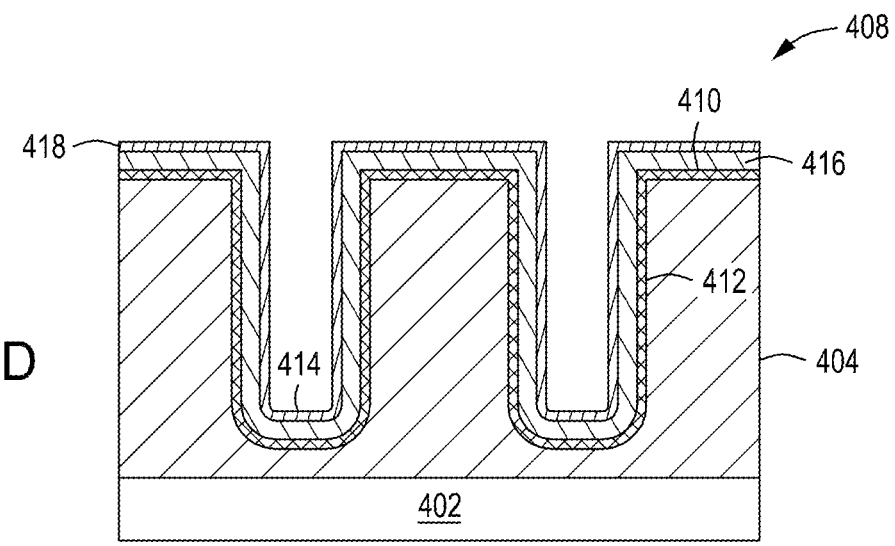

At black 335, an optional wetting layer deposition to deposit a wetting layer 418 on the barrier layer 416 may be carried out, as shown in FIG. 4D, The wetting layer can be deposited by, for example, a process selected from CVD TiN, PVD TiN, CVD Ru, PVD Ru, nitridation of PVD Ti, or combinations thereof.

In embodiments using a CVD process to deposit the wetting layer 418, a desired precursor gas is provided to the chamber and may be further provided in the presence of a carrier gas.

In embodiments using a PVD process to deposit the wetting layer 418, a target comprising the desirable material to be deposited is provided and a PVD process is performed to deposit a PVD wetting layer. In an embodiment, the wetting layer comprises PVD TiN. In such embodiments, a Ti target can be provided and bombarded with ions to sputter Ti to deposit the wetting layer 418 over the barrier layer 416, A nitridation process using a nitrogen containing precursor, such as NH3, in the presence of a plasma can be performed on the PVD Ti layer to form the TiN wetting layer 418. In such embodiments, the wetting layer 418 comprises a nitrided Ti layer and only the top few angstroms of titanium are converted to a TiN compound.

At block 340, an optional annealing process on the wetting layer 418 can be performed. The annealing process may reduce surface roughness of the wetting layer 418, increase grain size of the crystalline structure, and reduce impurities, such as carbon, that may be present in the wetting layer 418. The annealing process can be performed at a temperature of between about 200° C. to about 500° C. In embodiments, the annealing process can be performed for a duration of between about 10 seconds to about 1000 seconds.

Figure 4E:
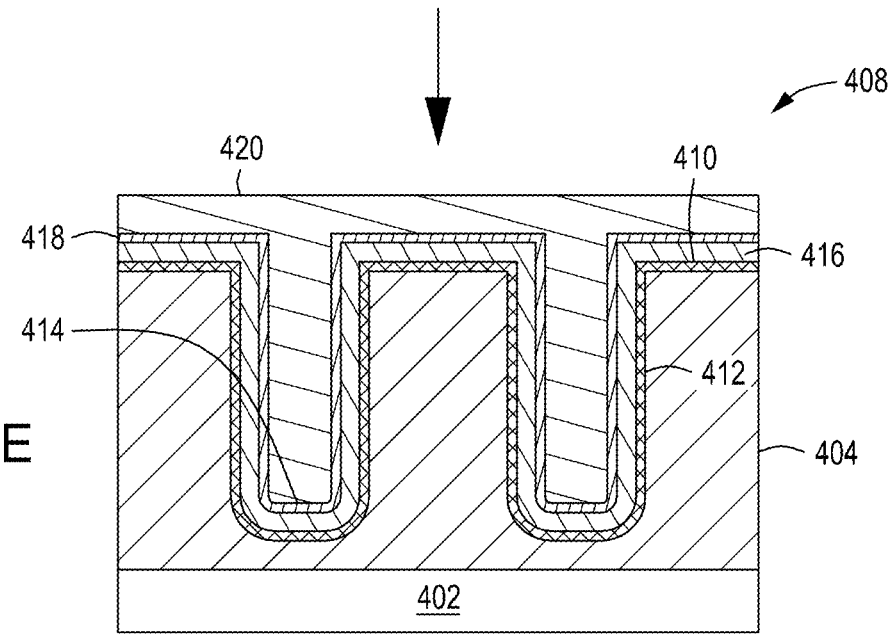

At block 350, a contact metal deposition process may be performed in the processing chamber to deposit a metal contact layer 420, as shown in FIG. 4E. The metal contact layer 420 may be deposited using a cyclic deposition process. The metal contact layer 420 can thereby fill the feature 406 without a seam therein.

The metal contact layer 420 may be deposited using a multi-step deposition process comprising multiple cycles of performing a cyclic metal deposition process to deposit the metal contact layer 420.

The metal contact layer 420 can be deposited by, for example, atomic layer deposition (ALD), plasma enhanced atomic layer deposition (PEALD), chemical vapor deposition (CVD), plasma enhanced CVD (PECVD), or physical vapor deposition (PVD). In embodiments, a thickness of the metal contact layer 420 can be less than 50% of the feature diameter (critical dimension) of the smallest feature to be filled.

In embodiments, the cyclic metal deposition process can be performed to partially fill a feature to less than half of the feature diameter followed by an optional anneal process at block 350. The cyclic deposition process followed by an optional anneal could then be repeated until the metal contact layer 420 achieves a predetermined thickness. In alternative embodiments, the metal contact layer 420 may be deposited to completely fill the feature in a single, non-cyclic deposition process. In such embodiments, the metal contact layer 420 may then be optionally annealed.

At block 360, the metal contact layer 420 may optionally undergo a plasma treatment process. The plasma treatment process may provide a process gas, such as H2, to the chamber and applying an RF current to form the process gas into a plasma. In an embodiment, the frequency of the RF current can be between about 200 W and about 800 W. The plasma treatment process may be performed for about 1 second to about 60 seconds. In an embodiment, the substrate 402 may be heated to a temperature of between about 100° C. to about 200° C. to further reduce surface roughness of the metal contact layer 420 and reduce the percentage of impurities that may be present in the metal contact layer 420.

At block 370, an annealing process on the metal contact layer 420 may be optionally performed. The annealing process may reduce surface roughness of the metal contact layer 420 and reduce impurities, such as carbon, that may be present in the metal contact layer 420, Further the annealing process may increase crystalline grain size which results in lower resistivity, resulting in improved integrated circuit performance. The annealing process can be performed at a temperature of between about 250° C. to about 350° C. The annealing process may be performed in a chamber environment where an inert gas, such as argon, and a process gas, such as $H_2$, are provided in the chamber. In some embodiments, the annealing process can be performed between about 30 seconds and about 90 seconds.

Figure 5:
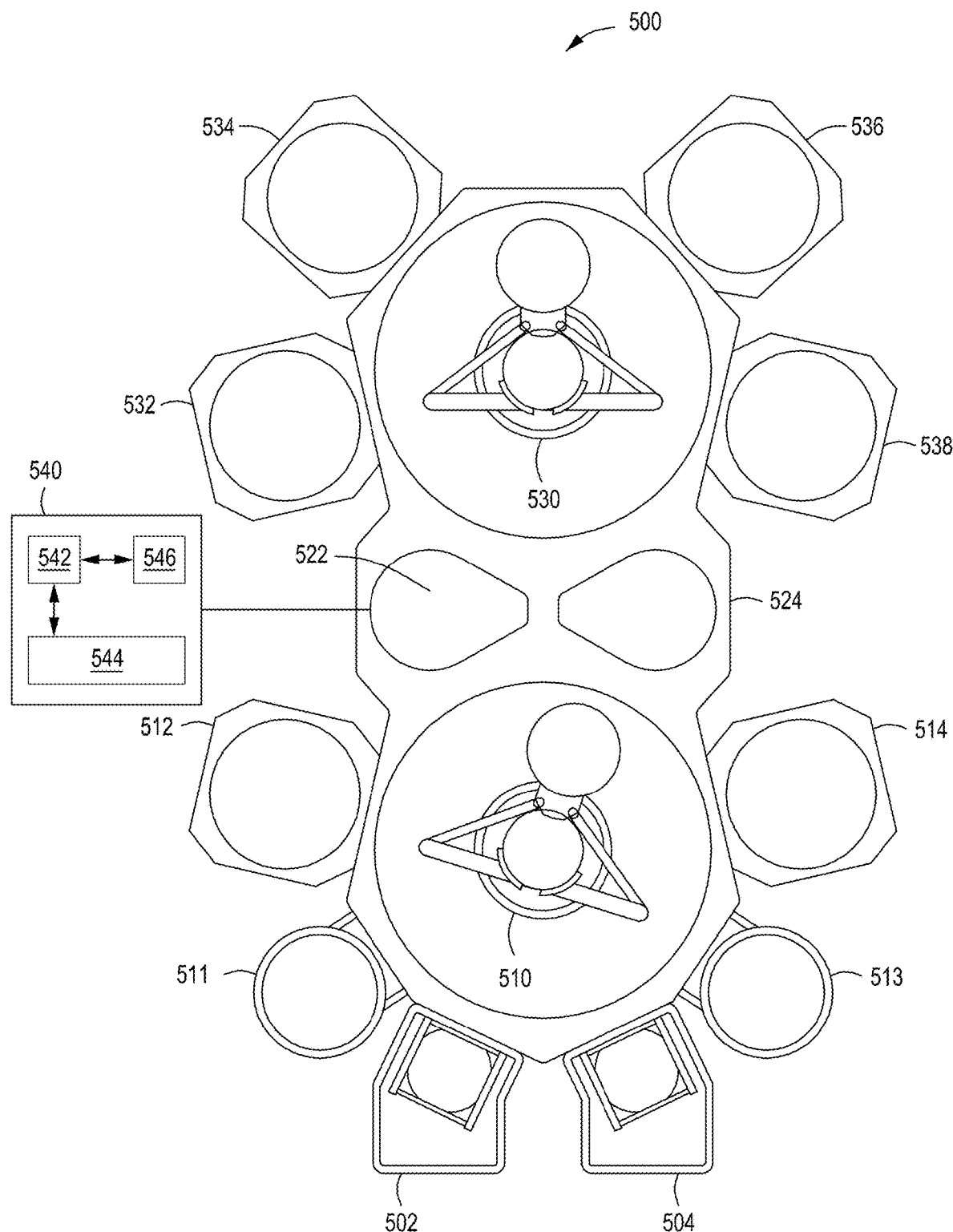
FIG. 5 depicts a schematic top-view diagram of an illustrative multi-chamber processing system in accordance with embodiments of the present disclosure.

FIG. 5 depicts a schematic top-view diagram of an illustrative multi-chamber processing system 500 that can be adapted to perform the processes as disclosed hereinabove. The multi-chamber processing system 500 includes multiple processing chambers configured to perform different processes incorporated into the multi-chamber processing system 500.

The multi-chamber processing system 500 includes one or more load lock chambers 502, 504 for transferring substrates into and out of the system 500. Typically, since the system 500 is under vacuum, the load lock chambers 502, 504 can "pump down" the substrates being introduced into the multi-chamber processing system 500. A first robot 510, disposed in a first transfer chamber, can transfer the substrates between the load lock chambers 502, 504, and a first set of one or more substrate processing chambers such as processing chambers 511, 512, 513, 514. Each processing chamber 511, 512, 513, 514 is configured to perform at least one substrate processing operation, such as an etching process, a treatment process, a deposition process (such as ALD, CVD, PECVD, PVD, or the like), degas, pre-cleaning, orientation and other substrate processes including processes of the present disclosure.

In some embodiments, the first robot 510 can also transfer substrates to/from one or more pass-through chambers 522, 524. The pass-through chambers 522, 524 can be used to maintain ultra-high vacuum conditions while allowing substrates to be transferred to a second transfer chamber within the system 500. A second robot 530 is disposed in the second transfer chamber and can transfer the substrates between the pass-through chambers 522, 524 and a second set of one or more processing chambers 532, 534, 536, 538. The processing chambers 532, 534, 536, 538 are configured to perform one or more specific substrate processes including the processes described herein as well as other suitable processes that may be performed prior to or subsequent to the processes disclosed herein. For example, at least one processing chamber 532, 534, 536, 538 is configured to perform a substrate processing operation, such as a deposition process (for example, ALD, CVD, PECVD, PVD, or the like), in accordance with the methods described herein:

Any of the processing chambers 511, 512, 513, 514, 532, 534, 536, 538 can be removed from the multi-chamber processing system 500 if not necessary for a process to be performed by the system 500.

In some embodiments, the multi-chamber processing system 500 includes at least one first deposition chamber configured to deposit a first layer atop a substrate and within a feature formed in the substrate, such as the barrier layer 206 described above. In some embodiments, the multi-chamber processing system 500 further includes at least one a second deposition chamber configured to deposit a metal fill layer, such as the metal fill layer 208 described above. For example, the first deposition chamber and the second deposition chamber can be one of an ALD chamber, a CVD chamber, a PECVD chamber, a PVD chamber, or the like, specifically configured to deposit one or more of the materials described above. In some embodiments, for example when an Ru film is being used, one or more of the processing chambers of the multi-chamber processing system 500 can be an anneal chamber configured to perform the above-described anneal process on the deposited Ru film.

A micro-processor controller 540 may be provided and coupled to various components of the multi-chamber processing system 500 to control the operation thereof. The controller 540 includes a central processing unit (CPU) 542, a memory 546, and support circuits 544. The controller 540 may control the multi-chamber processing system 500 directly, or via other computers (or controllers) associated with particular process chamber and/or support system components. The controller 540 may be one of any form of general-purpose computer processor that can be used in an industrial setting for controlling various chambers and sub-processors. The memory 546, or computer readable medium, of the controller 540 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 544 are coupled to the CPU for supporting the processor in a conventional manner. These circuits include cache, power supplies, clock circuits, input/output circuitry and subsystems, and the like. Inventive methods as described herein may be stored in the memory 546 as software routine that may be executed or invoked to control the operation of the multi-chamber processing system 500, or the individual processing chambers coupled thereto, in the manner described herein. The software routine may also be stored and/or executed by a second CPU (not shown) that is remotely located from the hardware being controlled by the CPU.

While the foregoing is directed to embodiments of the present disclosure, other and further embodiments of the disclosure may be devised without departing from the basic scope thereof.

We claim:

1. A method of forming a contact structure in a semiconductor device having a feature, comprising:

forming a conformal barrier layer over a top surface of the semiconductor device, along sidewalls and a bottom of the feature, wherein the conformal barrier layer is TiN;

forming a wetting layer over the conformal barrier layer by PVD deposition of a Ti layer over the conformal barrier layer, followed by nitridation of the Ti layer using a nitrogen containing precursor in the presence of a plasma to form the wetting layer wherein a lower portion of the wetting layer is Ti, and only an upper portion of the wetting layer comprises TiN; and forming a metal layer comprising at least about 80% aluminum (Al) by weight over the wetting layer over the top surface, along the sidewalls, and the bottom of the feature by chemical vapor deposition at a temperature from about 100° C. to about 300° C. without annealing, wherein the metal layer disposed within the feature does not include a seam and/or voids.

2. The method of claim 1, wherein the barrier layer is at least about 50% TiN by weight.

3. The method of claim 1, wherein the metal layer consists essentially of aluminum (Al).

* * * * *